United States Patent
Miyagawa

(10) Patent No.: US 10,161,964 B2
(45) Date of Patent: Dec. 25, 2018

(54) INSPECTION UNIT

(71) Applicant: YOKOWO CO., LTD., Tokyo (JP)

(72) Inventor: Masataka Miyagawa, Tomioka (JP)

(73) Assignee: Yokowo Co., Ltd., Tokyo (JP)

( * ) Notice: Subject to any disclaimer, the term of this patent is extended or adjusted under 35 U.S.C. 154(b) by 98 days.

(21) Appl. No.: 14/951,637

(22) Filed: Nov. 25, 2015

(65) Prior Publication Data

US 2016/0154024 A1    Jun. 2, 2016

(30) Foreign Application Priority Data

Nov. 27, 2014    (JP) ................. 2014-240476

(51) Int. Cl.
| | |
|---|---|
| G01R 31/02 | (2006.01) |
| G01R 31/28 | (2006.01) |
| G01R 1/04 | (2006.01) |
| G01R 1/067 | (2006.01) |
| G01R 1/073 | (2006.01) |
| H01R 12/00 | (2006.01) |

(52) U.S. Cl.
CPC ........... *G01R 1/0466* (2013.01); *G01R 1/045* (2013.01); *G01R 1/06722* (2013.01); *G01R 1/06733* (2013.01)

(58) Field of Classification Search
CPC .......... G01R 31/02; G01R 31/28; G01R 1/04; G01R 1/067; G01R 1/073; H01R 12/00
USPC ...... 324/754, 755, 755.05, 755.11, 757, 758, 324/761; 439/55, 66
See application file for complete search history.

(56) References Cited

U.S. PATENT DOCUMENTS

| | | | |
|---|---|---|---|
| 6,204,680 B1* | 3/2001 | Swart ................... | G01R 1/0483 324/754.08 |
| 6,337,572 B1* | 1/2002 | Kazama .................. | G01R 3/00 324/755.05 |
| 6,503,089 B2* | 1/2003 | Saijo ...................... | G01R 1/045 439/70 |
| 6,556,033 B1* | 4/2003 | Kazama ............. | G01R 1/06722 324/755.05 |
| 6,902,410 B2* | 6/2005 | Watanabe .............. | G01R 1/045 439/66 |
| 7,507,110 B1* | 3/2009 | Yin ........................ | H01R 11/18 439/482 |

(Continued)

FOREIGN PATENT DOCUMENTS

| | | |
|---|---|---|
| JP | 2001-091538 A | 4/2001 |
| JP | 2005-156530 A | 6/2005 |

(Continued)

OTHER PUBLICATIONS

Japanese Office Action dated Aug. 29, 2018 in corresponding Japanese Patent Application No. 2014-240476 with English translation of same.

*Primary Examiner* — Neel Shah
(74) *Attorney, Agent, or Firm* — Morgan, Lewis & Bockius LLP

(57) ABSTRACT

An inspection unit includes: a metal block having at least a through hole; a ground bush disposed in the through hole, and being an electrically conductive body including: a cylindrical body part; and a projected part which is projected sideward from an outer face of the body part, and which is in contact with an area around an opening of the through hole in the metal block; and a contact probe for ground passing through an interior of the ground bush.

8 Claims, 10 Drawing Sheets

(56) References Cited

U.S. PATENT DOCUMENTS

| | | | |
|---|---|---|---|
| 7,950,927 B2* | 5/2011 | Kazama | G01R 1/0466 439/66 |
| 2004/0029412 A1* | 2/2004 | Hachuda | G01R 1/06722 439/66 |
| 2004/0212383 A1* | 10/2004 | Yanagisawa | G01R 1/0441 324/754.08 |
| 2005/0227546 A1* | 10/2005 | Sekiguchi | H01R 13/2421 439/700 |
| 2007/0001692 A1 | 1/2007 | Yamada | |
| 2007/0111560 A1 | 5/2007 | Kazama et al. | |
| 2007/0145991 A1* | 6/2007 | Yoshida | G01R 1/045 324/755.01 |
| 2009/0093161 A1 | 4/2009 | Kazama et al. | |
| 2010/0066394 A1* | 3/2010 | Todoroki | G01R 1/06722 324/755.05 |
| 2010/0231249 A1* | 9/2010 | Dang | G01R 1/0675 324/754.18 |
| 2011/0117796 A1* | 5/2011 | Oishi | G01R 1/06722 439/841 |
| 2014/0253163 A1* | 9/2014 | Suzuki | G01R 1/06722 324/755.05 |

FOREIGN PATENT DOCUMENTS

| | | |
|---|---|---|
| JP | 2007-12475 A | 1/2007 |
| JP | 2010-060527 A | 3/2010 |
| JP | 2010-164439 A | 7/2010 |

* cited by examiner

CONTACT WITH PROBE

CONTACT WITH BLOCK

INSPECTION UNIT

CROSS-REFERENCE TO RELATED APPLICATION(S)

This application is based upon and claims the benefit of priority from prior Japanese patent application No. 2014-240476, filed on Nov. 27, 2014, the entire contents of which are incorporated herein by reference.

BACKGROUND

The present invention relates to an inspection unit which is used for inspecting an electronic component to be inspected such as a semiconductor integrated circuit, and more particularly, relates to a connecting structure between a contact probe for ground and a metal block in the inspection unit having the contact probe for ground.

FIG. 12A is a sectional front view of a related-art inspection unit which forms a socket for high frequency, showing a region for mounting a contact probe for ground, and FIG. 12B is a sectional front view of a ground tube in the related-art inspection unit for interconnecting the contact probe for ground and a metal block. In FIG. 12A, a contact probe 1 for ground is an electrically conductive body having an electrically conductive tube 2 in a cylindrical shape, and electrically conductive plungers 3, 4 which are urged so as to protrude from the electrically conductive tube 2 by a spring which is incorporated therein. The contact probe 1 for ground is so arranged as to pass through a through hole 11 in a metal block (pin block) 10. Moreover, the contact probe 1 for ground is coaxially held with respect to an inner peripheral face of the through hole 11 by retainers (insulating fixing means) 12, 13 which are fixed to upper and lower faces of the metal block 10.

Interconnection between the contact probe 1 for ground and the metal block 10 is conducted using a ground tube 20 in FIG. 12B. The ground tube 20 is formed by rounding a sheet metal into a tubular shape. One end of the ground tube 20 is rounded so as to have a slightly smaller inner diameter than an outer diameter of the contact probe 1 for ground so that it can get in contact with an outer peripheral face of the probe 1, while the other end is enlarged in diameter so that it can get in contact with an inner peripheral face of the through hole 11. This ground tube 20 is disposed in a gap between the probe 1 and the metal block 10 thereby to establish electrical connection between them.

The related art as shown in FIG. 12A and FIG. 12B is disclosed as a related-art example, in JP-A-2010-60527.

By the way, the ground tube 20 in FIGS. 12A and 12B has such a shape that one side of the sheet metal is rounded to have a diameter capable of getting in contact with the contact probe 1 for ground, while the other side is enlarged so as to get in contact with an inner wall of the through hole in the metal block 10. The ground tube 20 is caused to be in contact with the metal block 10 and the contact probe 1, utilizing elasticity of the ground tube 20 which is enlarged, thereby to establish the electrical connection. For this reason, there are several problems which are listed below.

(1) Because the ground tube 20 is formed by folding a stamped metal sheet by hand into a trumpet shape, it is difficult to secure accuracy in size. Moreover, because the ground tube 20 is formed by hand, a manufacturing cost is high.

(2) Because the ground tube 20 is formed by hand, there is a large dispersion in diameter, and so, a problem of bad assembling performance occurs, as described below.

a. Because an edge of a small diameter part of the ground tube 20 bites into the contact probe 1, the contact probe 1 cannot be re-used, in some cases.

b. Because an edge of a large diameter part of the ground tube 20 bites into the inner face of the through hole in the metal block 10, it becomes difficult to remove the ground tube 20.

c. Movement of the contact probe 1 is restricted inside the metal block 10 by the ground tube 20 which is curved (and this causes a situation where the contact probe 1 can be inserted up to halfway only), and so, it is difficult to assemble the retainers 12, 13, in some cases.

SUMMARY

It is therefore an object of the invention to provide an inspection unit capable of reliably and stably conducting electrical connection between a contact probe for ground and a metal block, using a ground bush, and also capable of enhancing maintainability.

In order to achieve the object, according to the invention, there is provided an inspection unit comprising: a metal block having at least a through hole; a ground bush disposed in the through hole, and being an electrically conductive body including: a cylindrical body part; and a projected part which is projected sideward from an outer face of the body part, and which is in contact with an area around an opening of the through hole in the metal block; and a contact probe for ground passing through an interior of the ground bush.

The inspection unit may further comprise: an insulator plate superposed on one side of the metal block. The projected part may be held between the metal block and the insulating plate.

The metal block may include a plurality of divided bodies, and the projected part may be held between the divided bodies.

The projected part may be a flange part which is formed in one end part or in an intermediate part of the body part.

The projected part may include a single projected part radially extended in one direction from the one end part or the intermediate part of the body part.

The projected part may include a plurality of projected parts radially extended in a plurality of directions from the one end part or the intermediate part of the body part.

A force in a direction inclined or eccentric with respect to a center axis of the through hole may be applied to the contact probe, during inspecting operation.

The inspection unit may further comprise: an insulating plate disposed on one side of the metal block; and an insulating member disposed on the other side of the metal block. The contact probe may include: a tube; a first plunger passing through a through hole in the insulating member; and a second plunger passing through a though hole in the insulator plate, and an inner diameter of the ground bush may be smaller than inner diameters of parts of the through holes in the insulating member and the insulator plate, the parts of the through holes receiving end parts of the tube.

It is to be noted that optional combinations of the above described constituent elements, and descriptions of the invention which are converted between methods and systems are also effective as the features of the invention.

DETAILED DESCRIPTION OF EXEMPLARY EMBODIMENTS

Figure 1:
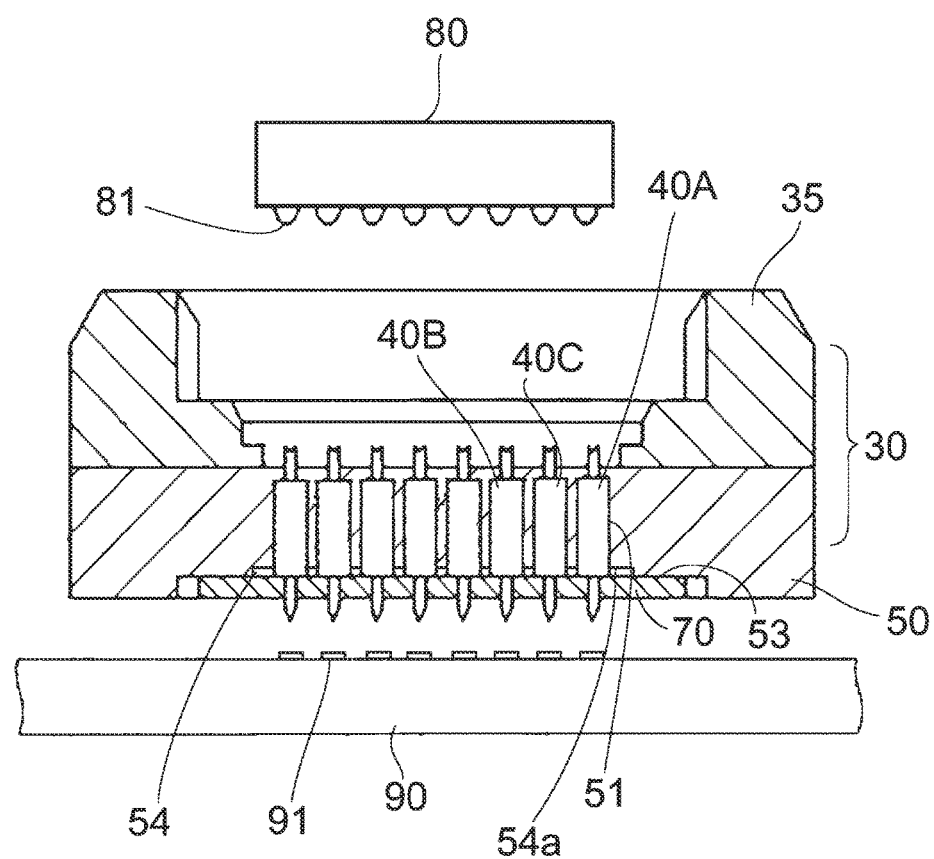
FIG. 1 is a schematic front view of an inspection unit, an electronic component to be inspected, and a board for inspection, in a first embodiment according to the invention, partly shown in section.

Now, preferred embodiments of the invention will be specifically described, referring to the drawings. It is to be noted that the same or equivalent constituent elements, members, processes, etc. which are shown in the respective drawings will be denoted with the same reference numerals, and overlapped descriptions will be appropriately omitted. Moreover, the embodiments do not limit the invention, but are only examples. All features and combinations of the features which are described in the embodiments are not necessarily essential to the invention.

Figure 2:
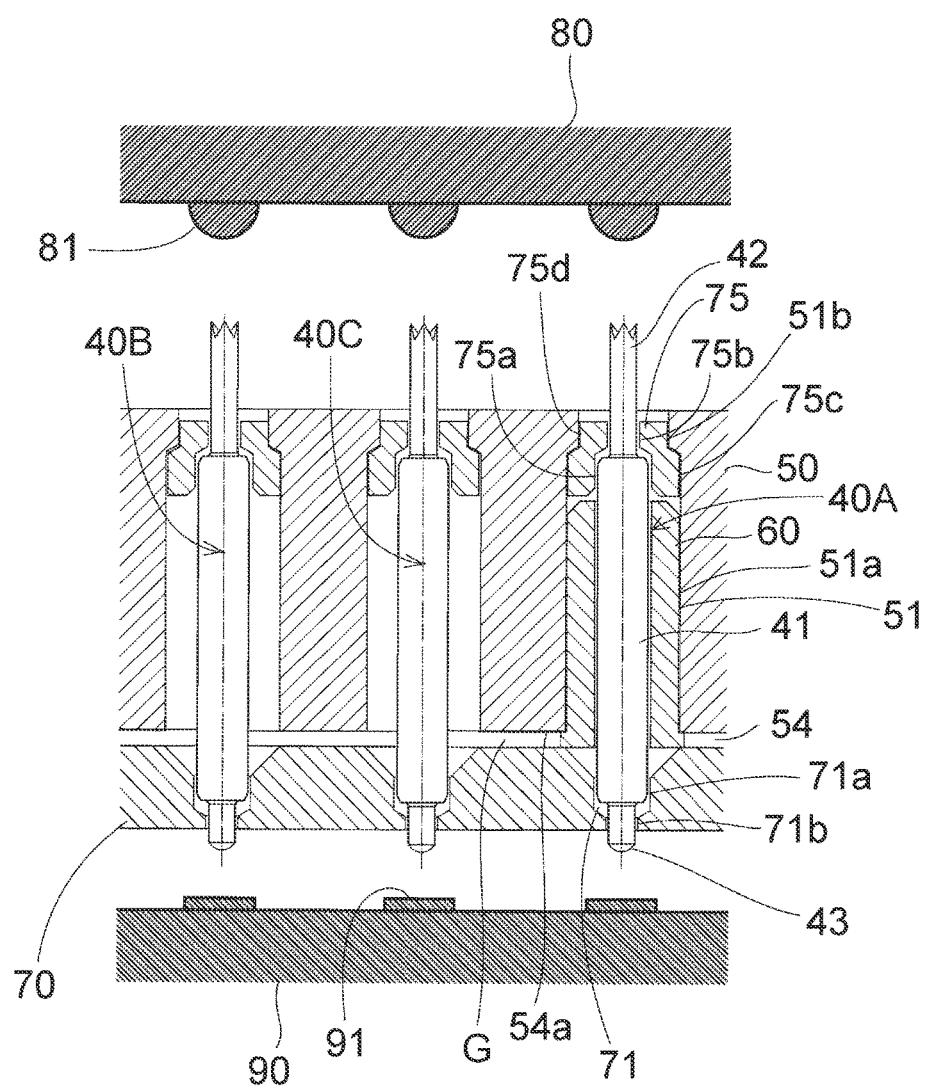
FIG. 2 is an enlarged sectional view of a part in FIG. 1.
Figure 3:
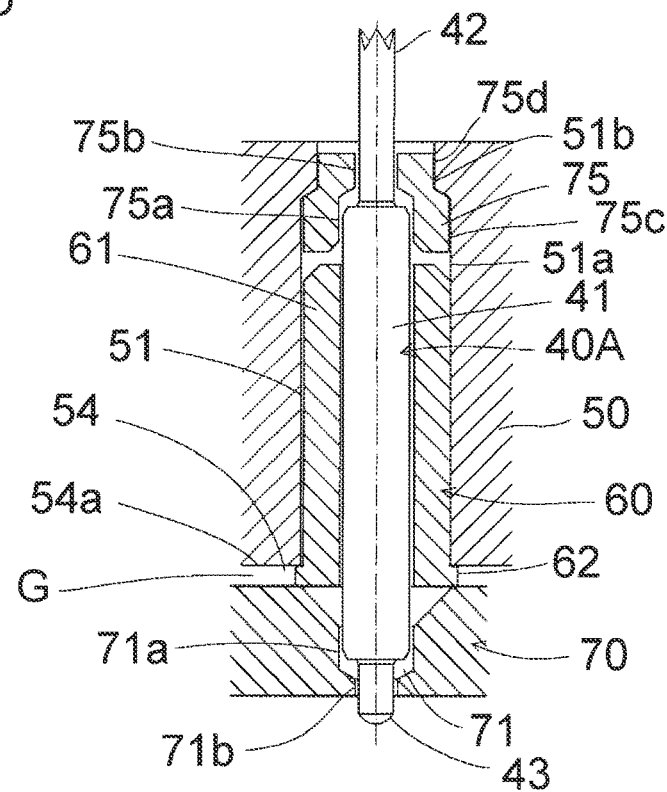
FIG. 3 is a sectional front view showing a region for mounting a contact probe for ground, using a ground bush, in the first embodiment.

FIG. 1 is a front view of an inspection unit (socket) 30, an electronic component 80 to be inspected, and an inspection board 90, in a first embodiment according to the invention, partly shown in section. FIG. 2 is an enlarged sectional view of a part in FIG. 1. FIG. 3 is a sectional front view of a region for mounting a contact probe 40A for ground, using a ground bush 60. As shown in these drawings, the inspection unit 30 which forms a socket for use in high frequency inspection includes a metal block (pin block) 50 provided with a number of through holes 51, a contact probe 40A for ground which is inserted and disposed in the through holes 51, a contact probe 40B for power supply, a contact probe 40C for high frequency signals, a ground bush 60 which is disposed around the contact probe 40A for ground, a resin plate (pin plate) 70 as an insulator plate, and an insulator ring 75 as an insulating member.

In this embodiment, all the through holes 51 in the metal block 50 have the same diameter, and the same contact probes 40A, 40B, and 40C having the same diameter are used. Each of the contact probes 40A, 40B, and 40C is so constructed that plungers 42, 43 formed of conductive metal are projected from both ends of a tube 41 formed of conductive metal by elasticity of a spring which is incorporated in the tube 41 (an internal structure will be described below).

The metal block 50 is formed of conductive metal such as brass, aluminum, and so on. A guide member 35 for guiding the electronic component 80 to be inspected at the time of inspection is fixed to one of faces (an upper face) of the metal block 50, while the other face (a bottom face) of the metal block 50 opposing to the board 90 for inspection is provided with a stepped part 53 which is dented for disposing the resin plate 70. A recess 54 is formed in the stepped part 53, and a gap G is formed between a bottom face 54a of the recess 54 and an opposed face of the resin plate 70 (A reason why the gap G is provided will be described below). The recess 54 includes therein a region where the contact probes 40A, 40B, 40C are disposed.

Each of the insulator rings 75 is formed of resin in an annular shape, and provided, at its inner side, with a large diameter inner peripheral part 75a for receiving a shoulder part of the contact probe 40A, 40B, 40C (an end part of the tube 41), and a small diameter inner peripheral part 75b having such a diameter that the plunger 42 of the contact probe 40A, 40B, 40C can pass through without being hindered. On the other hand, the insulator ring 75 is provided, at its outer side, a large diameter outer peripheral part 75c having the same diameter as a large diameter part 51a of the through hole 51, and a small diameter outer peripheral part 75d which is engaged with a small diameter part 51b at one end (at a side opposed to the electronic component 80 to be inspected, that is, an upper side) of the through hole 51. In this manner, the insulator ring 75 will not be detached from the metal block 50. It is to be noted that a diameter of the large diameter inner peripheral part 75a of the insulator ring 75 is set to be larger than a diameter of the shoulder part of the contact probe 40A, 40B, 40C (the tube 41), so that the contact probe 40A, 40B, 40C can move in a direction eccentric with respect to a center axis of the through hole 51. As the results, the contact probe 40A, 40B, 40C can be slightly inclined.

The metal block 50 is provided with the resin plate 70 at an opposite side to the side where the insulator rings 75 are disposed. On a surface of the resin plate 70 which is opposed to the metal block 50, there are formed recesses 71 at respective positions corresponding to the contact probes. In the same manner as the inner side of the insulator ring 75, each of the recesses 71 in the resin plate 70 is provided with a large diameter part 71a for receiving a shoulder part of the contact probe 40A, 40B, 40C (an end part of the tube 41), and a small diameter part 71b having such a diameter that the plunger 43 of the contact probe 40A, 40B, 40C can pass through without being hindered. Although the large diameter part 71a has the same diameter as the diameter of the shoulder part of the contact probe 40A, 40B, 40C (the tube 41), it is also possible to make the diameter larger, in the same manner as the insulator ring 75, so that the contact probe 40A, 40B, 40C can move in a direction eccentric with respect to the center axis of the through hole 51. Moreover, the large diameter part 71a is formed in a shape enlarged in a taper shape, at a side opposed to the metal block.

Figure 4A:
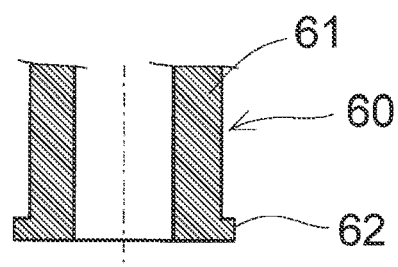
FIG. 4A is a sectional view showing a part of the ground bush.
Figure 4B:
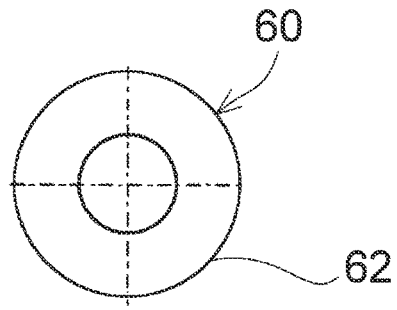
FIG. 4B is a bottom view of the part of the ground bush.

The ground bush 60 is inserted into the through hole 51 in which the contact probe 40A for ground is contained. As shown in FIGS. 4A, 4B, the ground bush 60 is formed of conductive metal, in the same manner as the metal block 50, and has a body part 61 in a tubular shape (a cylindrical shape) through which the contact probe 40A for ground passes through, and a flange part 62 as a projected part which is projected sideward (in a radial direction) from an outer peripheral face at one end of the body part 61 in a tubular shape (a cylindrical shape). The body part 61 has an outer diameter which is slightly smaller than the large diameter part 51a of the through hole 51, and an inner diameter which is slightly larger than the diameter of the contact probe 40A.

When the resin plate 70 is attached to the stepped face 53 of the metal block 50, the flange part 62 which is formed at the one end of the ground bush 60 is caught in the above described gap G between the metal block 50 and the resin plate 70, and brought into pressure contact with the one face of the metal block 50. Specifically, a thickness of the flange part 62 is set to be slightly larger than a depth of the recess 54 in the metal block 50, and consequently, the flange part 62 is held between the bottom face 54a of the recess 54 and an opposed face of the resin plate 70 thereby to be brought into contact with an area around an opening of the through hole 51 in the metal block 50, and electrically contacted therewith reliably. It is to be noted that the flange part 62 bites into the resin plate 70.

A diameter (a projecting amount) of the flange part 62 is set to have such a size that when the ground bushes 60 are disposed in the adjacent through holes 51, they may not interfere with each other. Moreover, an inner diameter of the ground bush 60 is set to be smaller than the diameter of the large diameter inner peripheral part 75a (a part for receiving the end of the tube 41) of the insulator ring 75. As the results, the outer periphery of the contact probe 40A for ground can be reliably contacted with an inner periphery of the ground bush 60. The reason for this will be described below, referring to FIG. 7.

The ground bush 60 has such a length that when the ground bush 60 is inserted into the through hole 51, the ground bush extends up to nearby the insulator ring 75 which is disposed at the one end of the through hole 51, that is, along a substantially entire length of the through hole 51. However, the ground bush 60 is not contacted with the insulator ring 75, but a gap is formed between them. This gap is formed for the purpose of assuring reliable contact between the flange part 62 and the metal block 50 (the area around the opening of the through hole 51). Moreover, the reason why the ground bush 60 extends up to nearby the insulator ring 75 is because good electrical performance (particularly, high frequency performance) can be obtained, in case where the electrical connection with the contact probe 40A is established at a position close to the electronic component 80 to be inspected.

Figure 5:
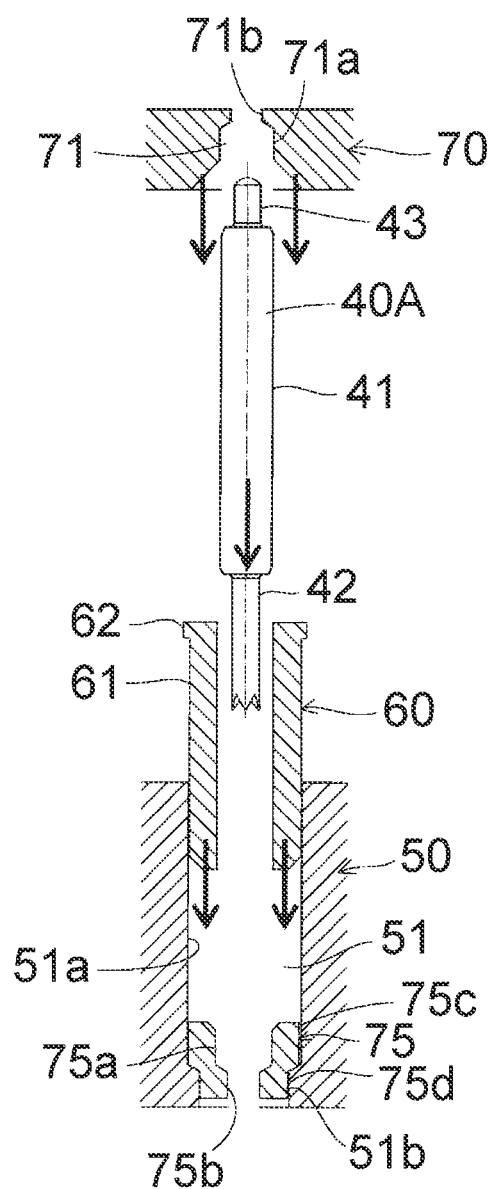
FIG. 5 is an exploded sectional view showing steps for mounting the contact probe for ground to a metal block, in case where the ground bush is used.

FIG. 5 shows steps for mounting the contact probe 40A for ground to the metal block 50, in case of using the ground bush 60. The metal block 50 is set upside down thereby to position the small diameter part 51b of the through hole 51 at a lower side. Then, the insulator ring 75 and the ground bush 60 are inserted into the through hole 51 in this order, and the contact probe 40A for ground is inserted into the inner periphery of the ground bush 60. Thereafter, the resin plate 70 is fixed to the metal block 50 with screws or the like. The resin plate 70 and the insulator ring 75 function as retainers for preventing removal of the contact probe 40A for ground and the ground bush 60 from the metal block 50. Moreover, concerning the other contact probes 40B, 40C, the resin plate 70 and the insulator ring 75 also function for securing insulation from the metal block 50.

Figure 6:
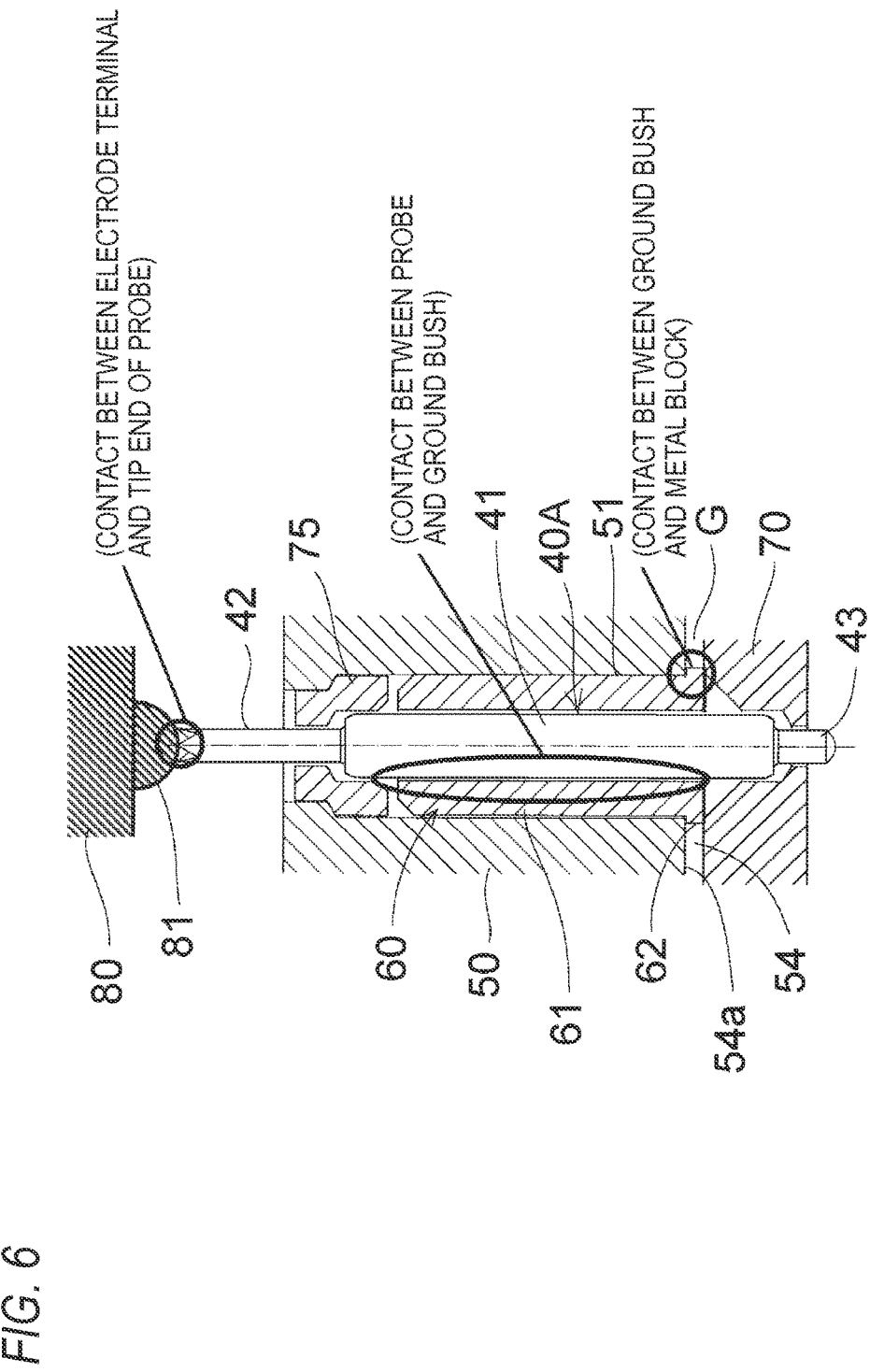
FIG. 6 is a sectional front view for explaining a route in which an electrode terminal of the electronic component to be inspected is electrically connected to the metal block by way of the contact probe for ground and the ground bush.

Referring to FIG. 6, a route in which an electrode terminal 81 of the electronic component 80 to be inspected is electrically connected to the metal block 50 by way of the contact probe 40A for ground and the ground bush 60 will be described. At the time of inspection, the plunger 42 of the contact probe 40A for ground presses the electrode terminal 81 of the electronic component 80 to be inspected and gets in contact with the electrode terminal 81. Then, the tube 41 which is electrically connected to the plunger 42 gets in contact with the inner peripheral face of the ground bush 60, and the flange part 62 of the ground bush 60 is brought into pressure contact with the metal block 50 thereby to perform the electrical connection. Further, at the time of inspection, the board 90 for inspection is fixed to the lower face of the metal block 50, and the resin plate 70 is compressed, by utilizing a force for tightly fastening the board 90 to the metal block 50. As the results, the flange part 62 of the ground bush 60 is pressed against the metal block 50, and with this effect, stabilized electrical connection can be obtained.

Figure 7:
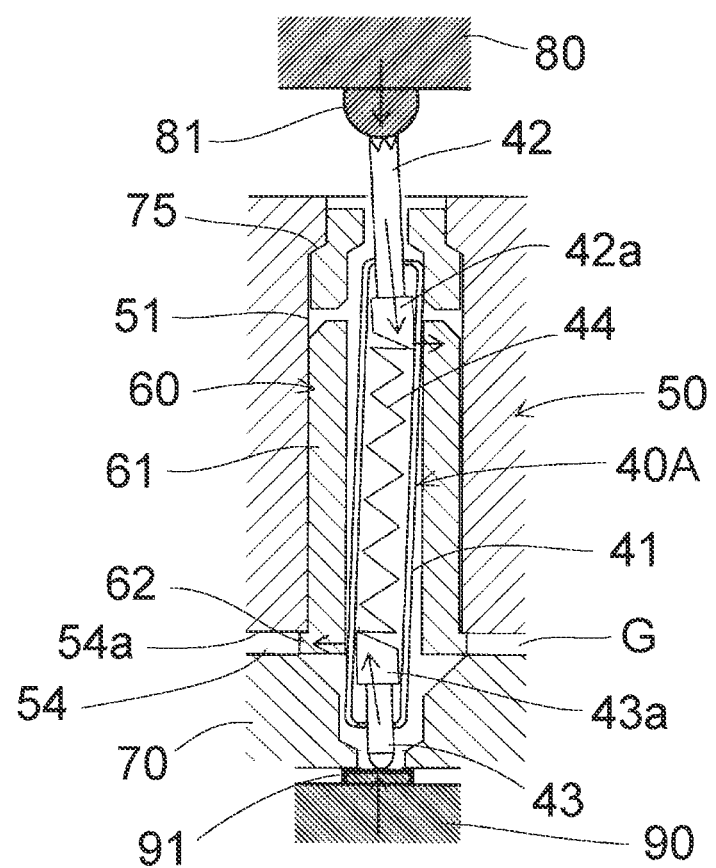
FIG. 7 is a sectional front view for explaining that the electrical connection between the contact probe for ground and the ground bush is reliably performed by an inclination of a tube of the contact probe for ground.

Referring to FIG. 7, a fact that the electrical connection between the contact probe 40A for ground and the ground bush 60 can be reliably performed by an inclination of the tube 41 of the contact probe 40A for ground will be described. As shown in FIG. 7, at the time of inspection, the upper and lower plungers 42, 43 of the contact probe 40A for ground are butted against the object to be inspected (the electrode terminal 81 of the electronic component 80 to be inspected and a wiring terminal 91 of the board 90 for inspection) thereby to be pushed into the tube 41. On this occasion, large diameter parts 42a, 43a of the plungers 42, 43 which are slidably contained in the tube 41 move toward the inner face of the tube, because faces of the plungers 42, 43 for receiving the spring 44 are inclined, and side pressures are exerted on the inner face of the tube. These side pressures push the tube 41 toward the ground bush 60, and the tube 41 is pressed against the inner face of the ground bush 60. In this manner, the electrical connection between the contact probe 40A for ground and the ground bush 60 can be reliably performed. In FIG. 7, the inclined faces of the respective plungers 42 and 43 are directed in different directions (the inclined face of the plunger 42 is directed downward and leftward, while the inclined face of the plunger 43 is directed upward and rightward), and therefore, the contact probe 40A for ground is inclined, enabling an upper part and a lower part of the tube 41 to be brought into contact with the ground bush 60.

In case where the inclined faces of the respective plungers 42 and 43 are directed in the same directions either rightward or leftward (for example, the inclined face of the plunger 42 is directed downward and leftward, while the inclined face of the plunger 43 is directed upward and leftward), the tube 41 moves sideward without being inclined by the side pressure, and comes into contact with the ground bush 60.

As described above, by making the contact probe 40A for ground eccentric with respect to the center axis of the through hole 51, utilizing the side pressures of the plungers 42, 43 on the inner face of the tube 41, the electrical connection between the contact probe 40A for ground and the ground bush 60 can be reliably performed. Therefore, the electrode terminal 81 of the electronic component 80 to be inspected and the wiring terminal 91 of the board 90 for inspection are electrically connected to each other by the contact probe 40A for ground, and at the same time, the electrode terminal 81 is electrically connected to the metal block 50 by way of the plunger 42 and the tube 41 of the contact probe 40A for ground, the ground bush 60, and the flange part 62 thereof, in a reliable and stabilized manner.

Therefore, in case where the inspection is conducted, after the electronic component 80 to be inspected is mounted and fixed to the inspection unit 30 utilizing the guide member 35, and the board 90 for inspection is disposed and fixed below the inspection unit 30, a ground current from the electrode terminal 81 of the electronic component 80 to be inspected which is in contact with a tip end of the contact probe 40A for ground flows to the contact probe 40A, passes to the ground bush 60 through a contact point between the contact probe 40A and the inner face of the ground bush 60, and further flows from the flange part 62 of the ground bush 60 to the metal block 50.

According to the embodiment, the following advantages can be obtained.

(1) Stabilization of ground conductivity can be achieved. Specifically, by an action for pressing the flange part 62 of the ground bush 60 against the one face of the metal block 50 (the area around the opening of the through hole 51) with the resin plate 70, the electrical connection of the ground current is further stabilized.

(2) It is possible to reliably perform the electrical connection between the contact probe 40A for ground and the ground bush 60, by making the contact probe 40A for ground eccentric with respect to the center axis of the through hole 51 in the metal block 50, utilizing the side pressures of the plungers 42, 43 of the contact probe 40A which are exerted on the inner face of the tube 41.

(3) Reduction of the cost can be achieved. Specifically, the ground bush 60 can be produced only by cutting, using a working machine. Unlike the related art, there is no need of forming an edge of the ground tube by hand, using a tool. Therefore, mass production within a short period can be carried out, and it is possible to remarkably reduce the manufacturing cost.

(4) Assembling performance can be improved. Specifically, the electrical connection of the ground bush 60 is performed utilizing the forces for pressing the respective metal components against each other, unlike the method in the related art in which the electrical connection is stabilized, by rendering edge parts of the ground tube to bite into the metal block and the side face of the probe. Therefore, it is possible to insert or remove the ground bush 60 using a pair of tweezers, without resistance. As the results, the inner face of the through hole in the metal block 50 and the side face of the contact probe 40A for ground will not be damaged, and it is possible to re-use the components.

(5) Because the ground bush 60 can be easily inserted or removed, all the through holes 51 in the metal block 50 are so formed as to have the same diameter, and at the same time, the contact probes having the same diameter can be used. Therefore, it is possible to freely change arrangement of the contact probes of various types, corresponding to an electrode pattern of the electronic component to be inspected.

Figure 8A:
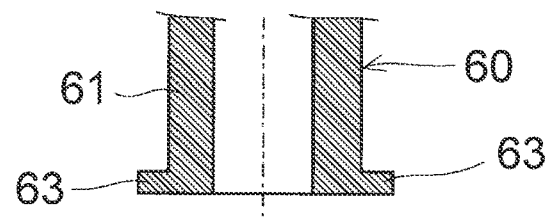
FIG. 8A is a sectional view showing a part of a ground bush in a second embodiment according to the invention.
Figure 8B:
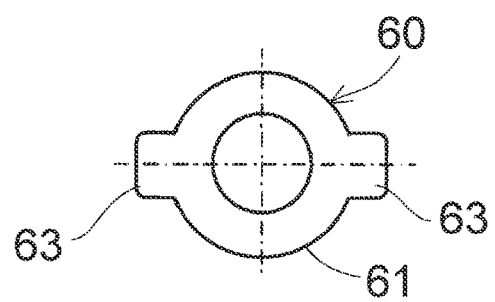
FIG. 8B is a bottom view of the part of the ground bush in the second embodiment.

FIGS. 8A and 8B show a second embodiment according to the invention. In this embodiment, the ground tube 60 has tongue piece parts 63 projected sideward from the outer face of the body part 61 in a tubular shape, which are formed at two positions (at an interval of 180 degrees) at the one end of the body part 61 (radially extended in a plurality of directions).

Figure 9A:
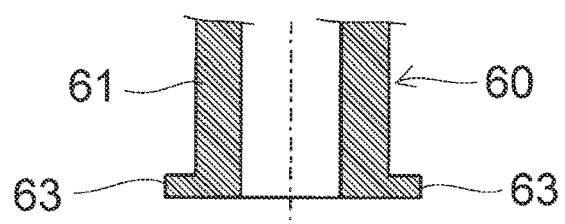
FIG. 9A is a sectional view showing a part of a ground bush in a third embodiment according to the invention.
Figure 9B:
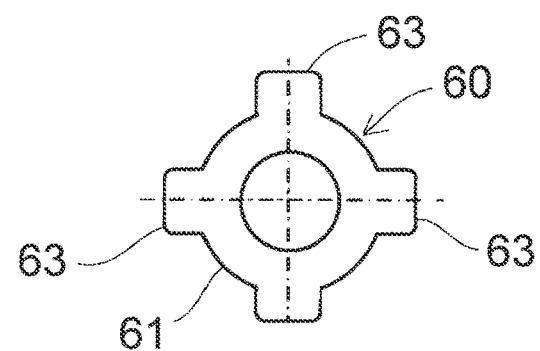
FIG. 9B is a bottom view of the part of the ground bush in the third embodiment.

FIGS. 9A and 9B show a third embodiment according to the invention. In this embodiment, the ground bush 60 has the tongue piece parts 63 projected sideward from the outer face of the body part 61 in a tubular shape, which are formed at four positions (at an interval of 90 degree) at the one end of the body part 61 (radially extended in a plurality of directions).

Figure 10A:
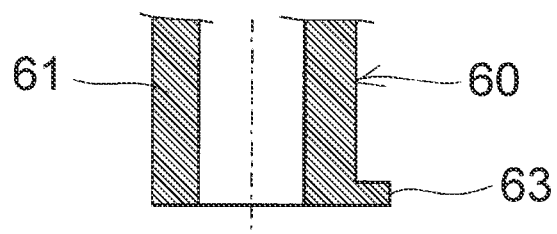
FIG. 10A is a sectional view showing a part of a ground bush in a fourth embodiment according to the invention.
Figure 10B:
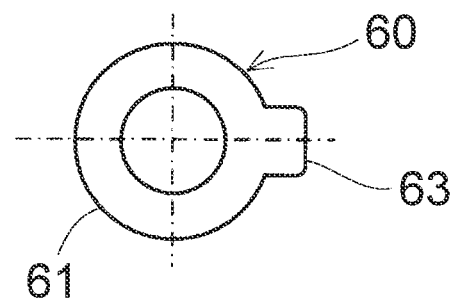
FIG. 10B is a bottom view of the part of the ground bush in the fourth embodiment.

FIGS. 10A and 10B show a fourth embodiment according to the invention. In this embodiment, the ground bush 60 has the tongue piece part 63 projected sideward from the outer face of the body part 61 in a tubular shape, which is formed at one position at the one end of the body part 61 (radially extended in one direction).

In the second to fourth embodiments too, the same operational effects as in the first embodiment can be obtained, by forming the other structures in the same manner as in the first embodiment.

Figure 11:
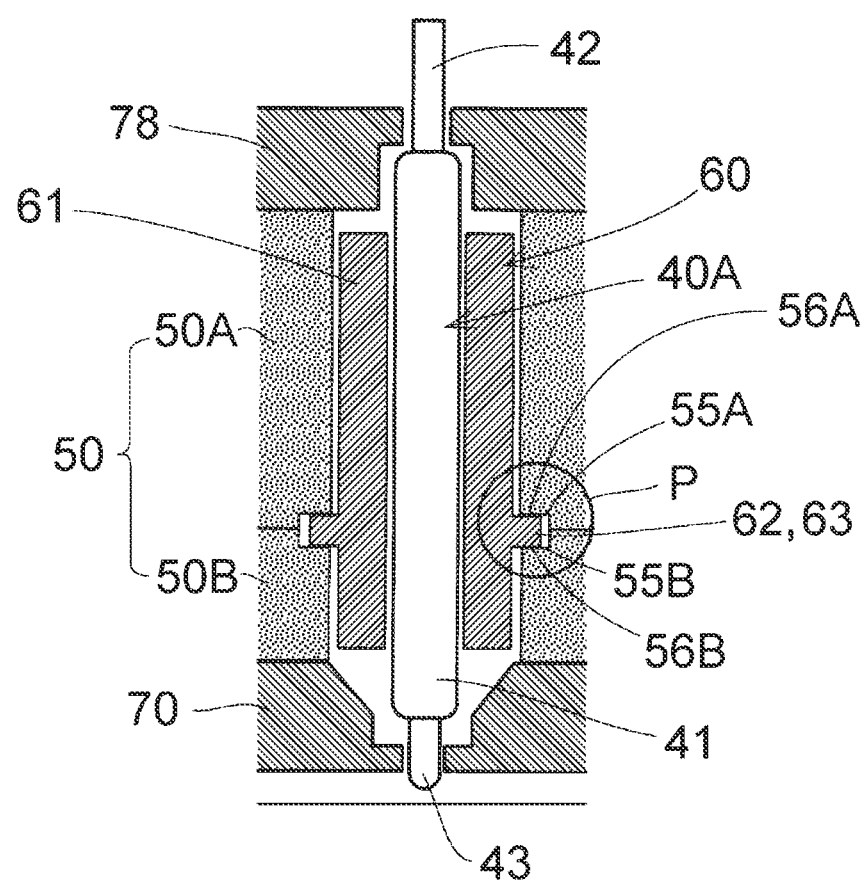
FIG. 11 is an enlarged sectional view showing a part of an inspection unit in a fifth embodiment according to the invention.
Figure 12A:
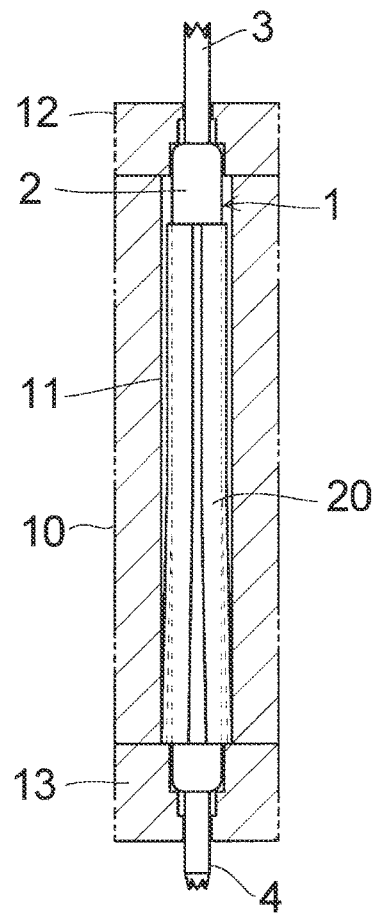
FIG. 12A is a sectional front view of a related-art inspection unit showing a region for mounting a contact probe for ground.
Figure 12B:
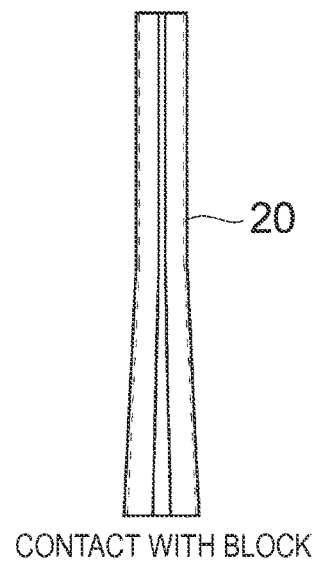
FIG. 12B is a sectional front view of a ground tube for connecting the contact probe for ground to a metal block, in the related-art inspection unit in FIG. 12A.

FIG. 11 shows a fifth embodiment according to the invention. In this embodiment, the electrical connection between the ground bush 60 and the metal block 50 is performed in an intermediate part (in an encircled part P) of the ground bush 60. Specifically, the metal block 50 is divided in two, and composed of an upper metal block 50A as an upper divided body and a lower metal block 50B as a lower divided body which are superposed and integrated. A projected part which is projected sideward from the outer face of the intermediate part of the body part 61 in a tubular shape of the ground bush 60, that is, the flange part 62 or the tongue piece part 63 is held between bottom faces 56A, 56B of recesses 55A, 55B which are respectively formed in the metal blocks 50A, 50B (comes into contact with the area around the openings of the through holes 51 in the upper and lower metal blocks 50A, 50B). By making a wall thickness of the flange part 62 or the tongue piece part 63 slightly larger than a distance between the bottom faces 56A and 56B, it is possible to bring the flange part 62 or the tongue piece part 63 into pressure contact with the upper and lower metal blocks 50A, 50B, and to reliably establish the electrical connection. Moreover, in place of the insulator ring 75 as the insulating member, a resin plate 78 as an insulator plate is superposed on the metal block 50 for the purpose of commonly supporting the respective contact probes in an insulated manner. It is to be noted that the other structures in this fifth embodiment is the same as those in the above described first embodiment.

Although the invention has been heretofore described referring to the embodiments by way of examples, it is to be understood by those skilled in the art that various modifications of the respective constituent elements and processes can be made within a scope described in the claims. Some examples of the modifications will be described below.

In the first embodiment, as the structure for generating the side pressures of the plungers of the contact probe for ground to be exerted on the inner face of the tube, the faces of the plungers for receiving the spring are inclined as shown in FIG. 7. However, the invention is not limited to this structure, but it is also possible to incline, for example, parts of the spring to be butted against the plungers, instead of inclining the faces of the plungers for receiving the spring.

In the first embodiment, the one end (upper side) of the contact probe is supported by the insulator ring in an insulated manner. However, it is also possible to use a resin plate as an insulator plate, in place of the insulator ring.

According to the inspection unit according to the present invention, it is possible to reliably and stably perform the electrical connection between the contact probe for ground and the metal block, by using the ground bush which has the cylindrical body part, and the projected part projected sideward from the outer periphery of the body part. Moreover, it is possible to enhance maintainability, because the contact probe for ground can be easily inserted or removed.

What is claimed is:

1. An inspection unit comprising:
a metal block having at least a through hole;
a ground bush disposed in the through hole, and being an electrically conductive body including: a cylindrical body part; and a projected part which is projected sideward from an outer face of the cylindrical body part, and which is in contact with an area around an opening of the through hole in the metal block;
a contact probe for ground passing through an interior of the ground bush, and
an insulating plate superposed on one side of the metal block,
wherein the projected part is held between the metal block and the insulating plate, and
wherein a force in a direction inclined or eccentric with respect to a center axis of the through hole is applied to the contact probe, during inspecting operation.

2. The inspection unit according to claim 1, wherein the projected part is a flange part which is formed in one end part of the cylindrical body part.

3. The inspection unit according to claim 2, wherein the projected part includes a single projected part radially extended in one direction from the one end part of the cylindrical body part.

4. The inspection unit according to claim 2, wherein the projected part includes a plurality of projected parts radially extended in a plurality of directions from the one end part of the cylindrical body part.

5. The inspection unit according to claim 1, wherein at least one resilient member is installed inside the contact probe for grounding to exert the force.

6. An inspection unit comprising:
a metal block having at least a through hole;
a ground bush disposed in the through hole, and being an electrically conductive body including: a cylindrical body part; and a projected part which is projected sideward from an outer face of the cylindrical body part, and which is in contact with an area around an opening of the through hole in the metal block;
a contact probe for ground passing through an interior of the ground bush,
an insulating plate superposed on one side of the metal block, and
an insulating member disposed on other side of the metal block,
wherein the projected part is held between the metal block and the insulating plate, and
wherein the contact probe includes: a tube; a first plunger passing through a through hole in the insulating member; and a second plunger passing through a through hole in the insulating plate, and
an inner diameter of the ground bush is smaller than inner diameters of parts of the through holes in the insulating member and the insulating plate, the parts of the through holes receiving end parts of the tube.

7. The inspection unit according to claim 6, wherein the first plunger projects from the metal block on the other side of the metal block; and
wherein the second plunger projects from the insulating plate on the one side of the metal block.

8. An inspection unit comprising:
a metal block having at least a through hole;
a ground bush disposed in the through hole, and being an electrically conductive body including: a cylindrical body part; and a projected part which is projected sideward from an outer face of the cylindrical body part, and which is in contact with an area around an opening of the through hole in the metal block;
a contact probe for ground passing through an interior of the ground bush, and
an insulating plate superposed on one side of the metal block,
wherein the projected part is held between the metal block and the insulating plate, and
wherein the contact probe is brought into electrical connection with the ground bush by inclining an upper part of the contact probe in one direction and inclining a lower part of the contact probe in an opposite direction.

* * * * *